United States Patent

Jansen et al.

(10) Patent No.: US 8,054,445 B2
(45) Date of Patent: Nov. 8, 2011

(54) LITHOGRAPHIC APPARATUS AND DEVICE MANUFACTURING METHOD

(75) Inventors: Hans Jansen, Eindhoven (NL); Christiaan Alexander Hoogendam, Westerhoven (NL); Timotheus Franciscus Sengers, s-Hertogenbosch (NL); Anthonie Kuijper, Breugel (NL)

(73) Assignee: ASML Netherlands B.V., Veldhoven (NL)

( * ) Notice: Subject to any disclaimer, the term of this patent is extended or adjusted under 35 U.S.C. 154(b) by 495 days.

(21) Appl. No.: 11/499,855

(22) Filed: Aug. 7, 2006

(65) Prior Publication Data

US 2007/0041001 A1     Feb. 22, 2007

Related U.S. Application Data

(63) Continuation-in-part of application No. 11/204,397, filed on Aug. 16, 2005, now abandoned.

(51) Int. Cl.
*G03B 27/52* (2006.01)
(52) U.S. Cl. ............................................. 355/30; 355/53
(58) Field of Classification Search .................... 355/53, 355/30
See application file for complete search history.

(56) References Cited

U.S. PATENT DOCUMENTS

| | | | |
|---|---|---|---|
| 3,573,975 A | 4/1971 | Dhaka et al. | 117/212 |
| 3,648,587 A | 3/1972 | Stevens | 95/44 |
| 4,346,164 A | 8/1982 | Tabarelli et al. | 430/311 |
| 4,390,273 A | 6/1983 | Loebach et al. | 355/125 |
| 4,396,705 A | 8/1983 | Akeyama et al. | 430/326 |
| 4,480,910 A | 11/1984 | Takanashi et al. | 355/30 |
| 4,509,852 A | 4/1985 | Tabarelli et al. | |
| 5,040,020 A | 8/1991 | Rauschenbach et al. | 355/53 |
| 5,121,256 A | 6/1992 | Corle et al. | 359/664 |
| 5,610,683 A | 3/1997 | Takahashi | 355/53 |
| 5,825,043 A | 10/1998 | Suwa | 250/548 |
| 5,900,354 A | 5/1999 | Batchelder | 430/395 |
| 6,191,429 B1 | 2/2001 | Suwa | 250/548 |
| 6,236,634 B1 | 5/2001 | Lee et al. | 369/112 |
| 6,600,547 B2 | 7/2003 | Watson et al. | 355/30 |
| 6,603,130 B1 | 8/2003 | Bisschops et al. | 250/492.1 |
| 6,952,253 B2 * | 10/2005 | Lof et al. | 355/30 |
| 2002/0020821 A1 | 2/2002 | Van Santen et al. | 250/492 |
| 2002/0163629 A1 | 11/2002 | Switkes et al. | 355/53 |
| 2003/0123040 A1 | 7/2003 | Almogy | 355/69 |
| 2004/0000627 A1 | 1/2004 | Schuster | 250/201.2 |
| 2004/0075895 A1 | 4/2004 | Lin | 359/380 |
| 2004/0114117 A1 | 6/2004 | Bleeker | 355/53 |
| 2004/0136494 A1 | 7/2004 | Lof et al. | |
| 2004/0160582 A1 | 8/2004 | Lof et al. | 355/30 |

(Continued)

FOREIGN PATENT DOCUMENTS

DE          206 607        2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner* — Edward Glick
*Assistant Examiner* — Mesfin T Asfaw
(74) *Attorney, Agent, or Firm* — Pillsbury Winthrop Shaw Pittman LLP

(57) ABSTRACT

A lithographic projection apparatus in which a liquid supply system and the geometry of the objects on the substrate table are arranged to avoid high velocity immersion liquid flowing over sensors.

18 Claims, 5 Drawing Sheets

U.S. PATENT DOCUMENTS

| | | | |
|---|---|---|---|
| 2004/0165159 A1 | 8/2004 | Lof et al. | 355/30 |
| 2004/0207824 A1 | 10/2004 | Lof et al. | |
| 2004/0211920 A1 | 10/2004 | Derksen et al. | 250/492.1 |
| 2004/0239954 A1 | 12/2004 | Bischoff | 356/635 |
| 2004/0263809 A1 | 12/2004 | Nakano | 355/30 |
| 2005/0007569 A1 | 1/2005 | Streefkerk et al. | 355/30 |
| 2005/0018155 A1 | 1/2005 | Cox et al. | 355/30 |
| 2005/0018156 A1* | 1/2005 | Mulkens et al. | 355/30 |
| 2005/0024609 A1 | 2/2005 | De Smit et al. | 355/18 |
| 2005/0030497 A1 | 2/2005 | Nakamura | 355/30 |
| 2005/0041225 A1* | 2/2005 | Sengers et al. | 355/30 |
| 2005/0046813 A1* | 3/2005 | Streefkerk et al. | 355/30 |
| 2005/0046934 A1* | 3/2005 | Ho et al. | 359/380 |
| 2005/0052632 A1* | 3/2005 | Miyajima | 355/53 |
| 2005/0078287 A1* | 4/2005 | Sengers et al. | 355/30 |
| 2005/0094116 A1* | 5/2005 | Flagello et al. | 355/53 |
| 2005/0094125 A1* | 5/2005 | Arai | 355/72 |
| 2005/0122505 A1* | 6/2005 | Miyajima | 355/72 |
| 2005/0132914 A1* | 6/2005 | Mulkens et al. | 101/463.1 |
| 2005/0134817 A1* | 6/2005 | Nakamura | 355/53 |
| 2005/0140948 A1* | 6/2005 | Tokita | 355/30 |
| 2005/0146693 A1* | 7/2005 | Ohsaki | 355/30 |
| 2005/0146694 A1* | 7/2005 | Tokita | 355/30 |
| 2005/0151942 A1* | 7/2005 | Kawashima | 355/30 |
| 2005/0200815 A1* | 9/2005 | Akamatsu | 353/53 |
| 2005/0213065 A1* | 9/2005 | Kitaoka | 355/53 |
| 2005/0213066 A1* | 9/2005 | Sumiyoshi | 355/53 |
| 2005/0219489 A1* | 10/2005 | Nei et al. | 355/53 |
| 2005/0233081 A1* | 10/2005 | Tokita | 427/256 |
| 2005/0237504 A1* | 10/2005 | Nagasaka et al. | 355/53 |
| 2005/0264778 A1* | 12/2005 | Lof et al. | 355/53 |
| 2006/0109447 A1* | 5/2006 | Moest et al. | 355/75 |
| 2006/0119816 A1* | 6/2006 | Baselmans et al. | 355/53 |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| EP | 1 420 300 A2 | 5/2004 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| JP | 2004/207711 A | 7/2004 |
| WO | WO 99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2005/010611 | 2/2005 |
| WO | 2005/020299 A1 | 3/2005 |
| WO | 2005/022616 A1 | 3/2005 |
| WO | WO 2005/024517 | 3/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", FUTURE FAB International, vol. 15, Jul. 11, 2003.

H. Kawata et al., "Fabrication of 0.2 μm Fine Patterns Using Optical Projection Lithography with an Oil Immersion Lens", Jpn. J. Appl. Phys. vol. 31, (1992), pp. 4174-4177.

G. Owen et al., "⅛ μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $\kappa_3$ coefficient in nonparaxial λ/NA scaling equations for resolution, depth of focus, and immersion lithography, *J. Microlith., Microfab., Microsyst.* 1(1):7-12 (2002).

Notice of Reasons for Rejection for Japanese Patent Application No. 2006-221569 dated Sep. 30, 2009.

\* cited by examiner

Fig. 2
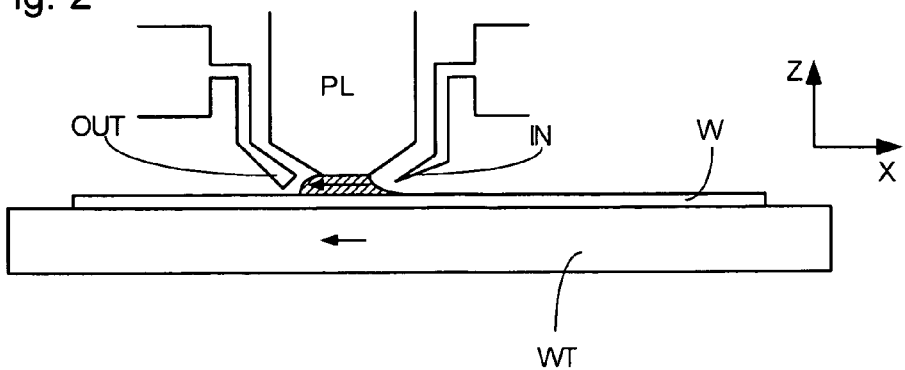
Fig. 3
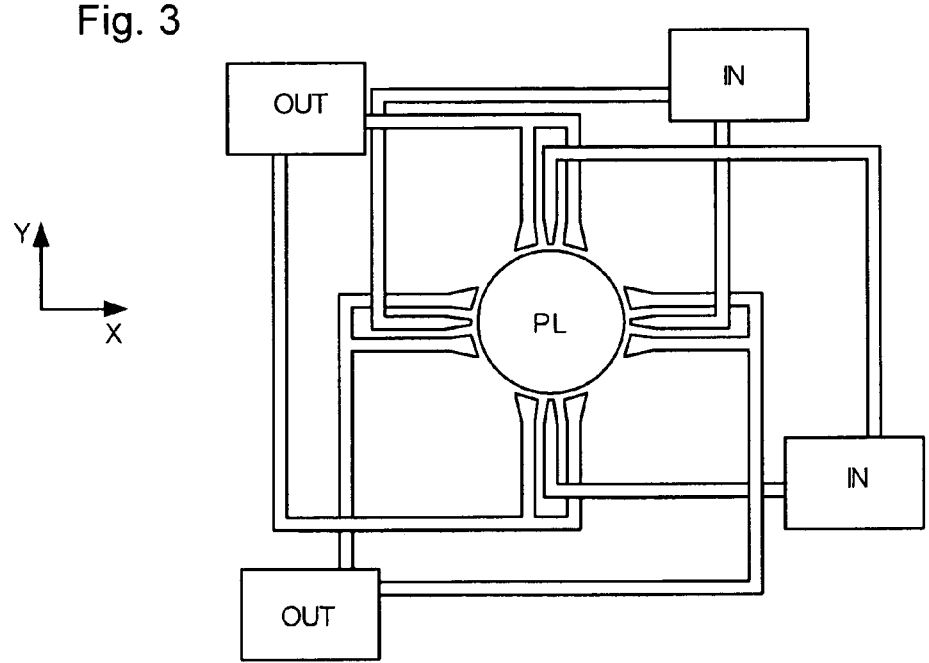
Fig. 4
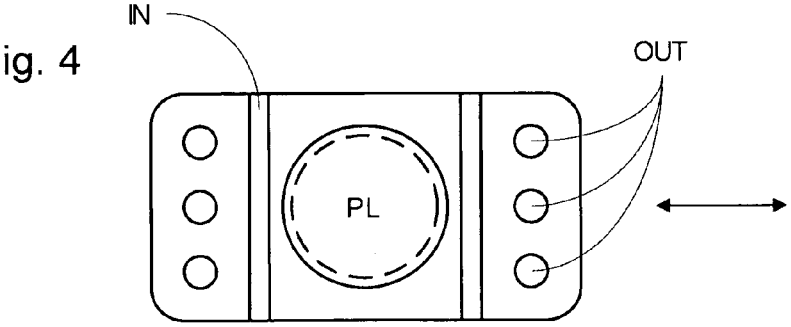
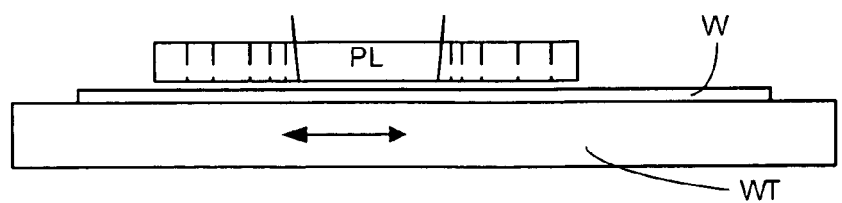

LITHOGRAPHIC APPARATUS AND DEVICE MANUFACTURING METHOD

RELATED APPLICATIONS

This application is a continuation-in-part of U.S. patent application Ser. No. 11/204,397, filed Aug. 16, 2005, now abandoned the entire contents of which is hereby incorporated by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application WO 99/49504. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another solution which has been proposed is to provide the liquid supply system with a liquid confinement structure which extends along at least a part of a boundary of the space between the final element of the projection system and the substrate table. The liquid confinement structure is substantially stationary relative to the projection system in the XY plane though there may be some relative movement in the Z direction (in the direction of the optical axis). A seal is formed between the liquid confinement structure and the surface of the substrate. In an embodiment, the seal is a contactless seal such as a gas seal. Such a system with a gas seal is disclosed in U.S. patent application Publication No. US 2004-0207824, hereby incorporated in its entirety by reference.

In European patent application publication no. EP 1420300 and United States patent application publication no. US 2004-0136494, each hereby incorporated in their entirety by reference the idea of a twin or dual stage immersion lithography apparatus is disclosed. Such an apparatus is provided with two tables for supporting the substrate. Leveling measurements are carried out with a table at a first position, without immersion liquid, and exposure is carried out with a table at a second position, where immersion liquid is present. Alternatively, the apparatus may have only one table movable between exposure and measurement positions.

There are various components on the substrate table which are to be imaged through immersion liquid. These may include a transmission image sensor (TIS), a spot sensor and an integrated lens interferometer at scanner (ILIAS) sensor.

SUMMARY

It is desirable to adapt conventional lithographic apparatus for compliance in the immersion environment.

According to an aspect of the invention, there is provided a lithographic projection apparatus arranged to project a pattern from a patterning device onto a substrate supported on a substrate table, the lithographic projection apparatus comprising a liquid supply system configured to supply liquid to fill a space between a projection system and a surface of the substrate table, wherein the liquid supply system is configured to provide liquid on a localized area of the surface and in the space on an area which can completely cover an exposed top surface of a sensor on the substrate table.

According to an aspect of the invention, there is provided a lithographic projection apparatus arranged to project a pattern from a patterning device onto a substrate, the apparatus comprising a substrate table constructed to hold a substrate and having a sensor and a liquid supply system configured to provide liquid between a projection system and a surface of the substrate table, wherein the sensor is positioned on the substrate table such that all parts of the substrate can be irradiated through liquid of the liquid supply system by the projection system without liquid from the liquid supply system coming into contact with the sensor.

According to an aspect of the invention, there is provided a lithographic projection apparatus arranged to project a pattern from a patterning device onto a substrate, the apparatus comprising a substrate table configured to support a substrate and a sensor, a liquid supply system configured to provide liquid in a space between a projection system and a surface of the substrate table, and a controller configured to control a flow volume of liquid, wherein the controller is configured to reduce the speed of the flow volume when the sensor is beneath the liquid supply system.

According to an aspect of the invention, there is provided a device manufacturing method comprising using a projection system to project a patterned beam of radiation through liquid, provided by a liquid supply system in a space between the projection system and a surface of the substrate table, onto a sensor supported on a substrate table, wherein the liquid supply system provides liquid to a localized area of the surface and in the space on an area which can completely cover an exposed top surface of the sensor.

According to an aspect of the invention, there is provided a device manufacturing method comprising projecting a patterned beam of radiation onto a substrate supported by a substrate table, a sensor being positioned on the substrate table, wherein the patterned beam of radiation is projected through a liquid contained by a liquid supply system onto the substrate and the whole of the top surface of the substrate is imaged without liquid from the liquid supply system coming into contact with the sensor.

According to an aspect of the present invention, there is provided a device manufacturing method comprising projecting a patterned beam of radiation through liquid, provided by a liquid supply system, onto a substrate supported by a substrate table, wherein following or preceding projecting the patterned beam of radiation onto a substrate, the patterned beam of radiation is projected through liquid, provided by the liquid supply system, onto a sensor also positioned on the substrate table during which projecting onto the sensor, a flow volume of liquid in the liquid supply system is reduced.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts a further liquid supply system for use in a lithographic projection apparatus;

DETAILED DESCRIPTION

Figure 1:
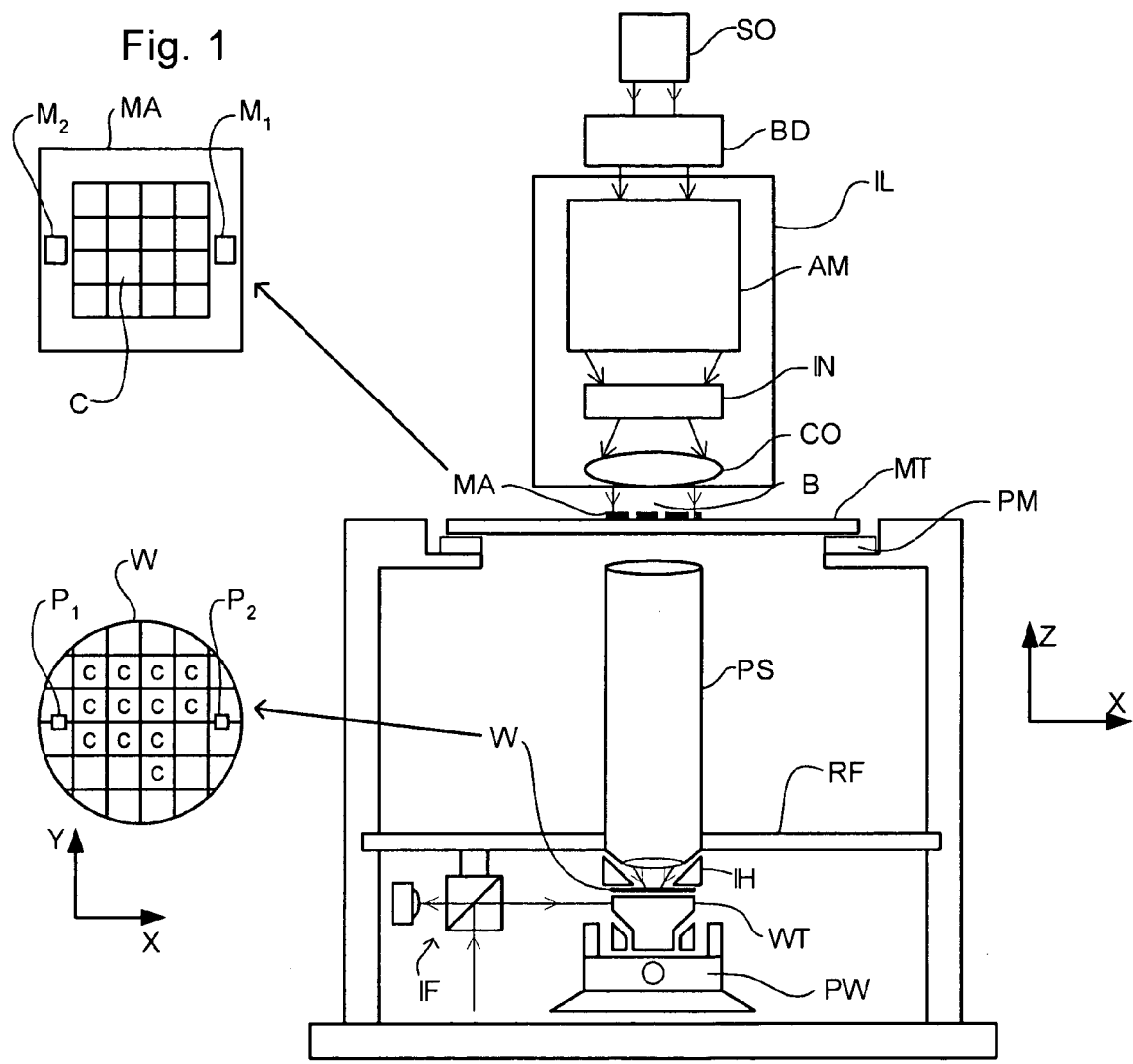
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 5:
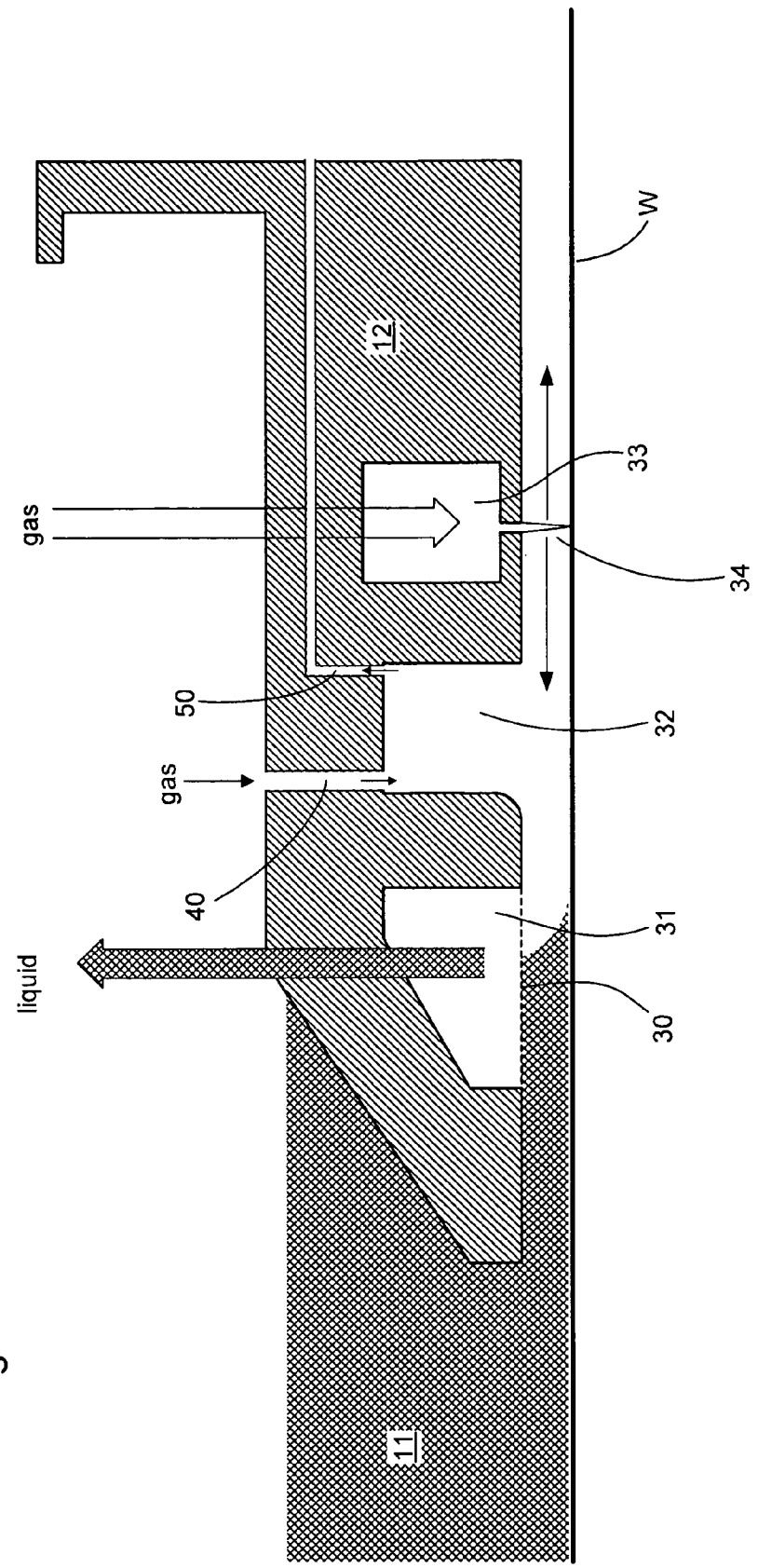
FIG. 5 depicts a section through a barrier member of a liquid supply system.

FIG. 5 illustrates a liquid confinement system in accordance with an embodiment of the present invention. Any other liquid confinement system may also be used in an embodiment of the present invention. A location of the liquid confinement/supply system is shown schematically as IH in FIG. 1.

FIG. 5 is a cross-section through a barrier member 12 which surrounds a space 11 which is filled with immersion liquid. The space 11 is defined as the volume surrounded by the barrier member 12 and does not include the volume of liquid sandwiched between the barrier member and the substrate—the space 11 is between the projection system PL and the substrate W. The barrier member 12 may be circular or any other shape so long as it provides an inner surface which defines the space 11.

A seal is formed between the bottom of the barrier member 12 and the surface on which the immersion liquid is provided, in the illustrated example the surface of a substrate W. Generally the area, in plan, of the space 11 is smaller than that of the substrate W so that immersion liquid is only provided to a localized area of the substrate W at any one time. Some relative movement between the barrier member 12 and the projection system PL (not illustrated) is possible but they generally remain stationary relative to one another and the substrate W is moved under the projection system PL and the barrier member 12. The space 11 is filled with immersion liquid so that the immersion liquid is provided between the projection system PL and the substrate W or other surface.

The seal between the barrier member 12 and the substrate W is effected by a liquid extractor 31 which provides a cavity which is at an under pressure. A mesh 30 on the underside of the barrier member 12 ensures that the cavity of the extractor is in fluid communication with the space 11 and that liquid is extracted out of extractor 31, which is a single phase extractor. A gas knife 33 is provided radially outwardly of the extractor 31. The gas knife provides a flow of gas 34. The gas flows radially inwardly towards a recess 32 (positioned between the extractor 31 and the gas knife) which has an inlet 40 that allows gas to flow into the recess 32 and an outlet 50 that extracts gas and/or immersion liquid. This arrangement is effective to maintain a meniscus of immersion liquid somewhere under the extractor 31. The extractor 31 and/or gas knife 33 may be considered a seal device configured to substantially contain the liquid in the space 11 of the barrier member 12.

Many of the liquid supply systems for a lithographic apparatus, including all of those illustrated in FIGS. 2-5, create a flow of liquid which may be higher in certain areas than in other areas. In the case of the embodiment illustrated in FIG. 5 in particular, the speed of the flow of liquid in the space 11 is lower than the flow elsewhere, e.g. under the barrier member 12. The high flow rate areas are often connected to sealing or maintaining the immersion liquid in the space 11.

It is desired to image not only the substrate with the projection system PL through immersion liquid but also one or more sensors which may be positioned on the top surface of the substrate table WT. These one or more sensors may include a transmission image sensor (TIS), a spot sensor and/or an integrated lens interferometer at scanner (ILIAS) sensor, used for sensing alignment or wave front. Typically the top surface of one or more of these sensors is vulnerable and can be damaged by prolonged high flow volume of liquid over them by a mechanism known as "streaming current" which is an electrical phenomenon in which damage to electrically conductive walls of a gap through which liquid flows is proportional to the amount of liquid (e.g., water) flowing between the barrier member 12 and sensor.

Figure 6:
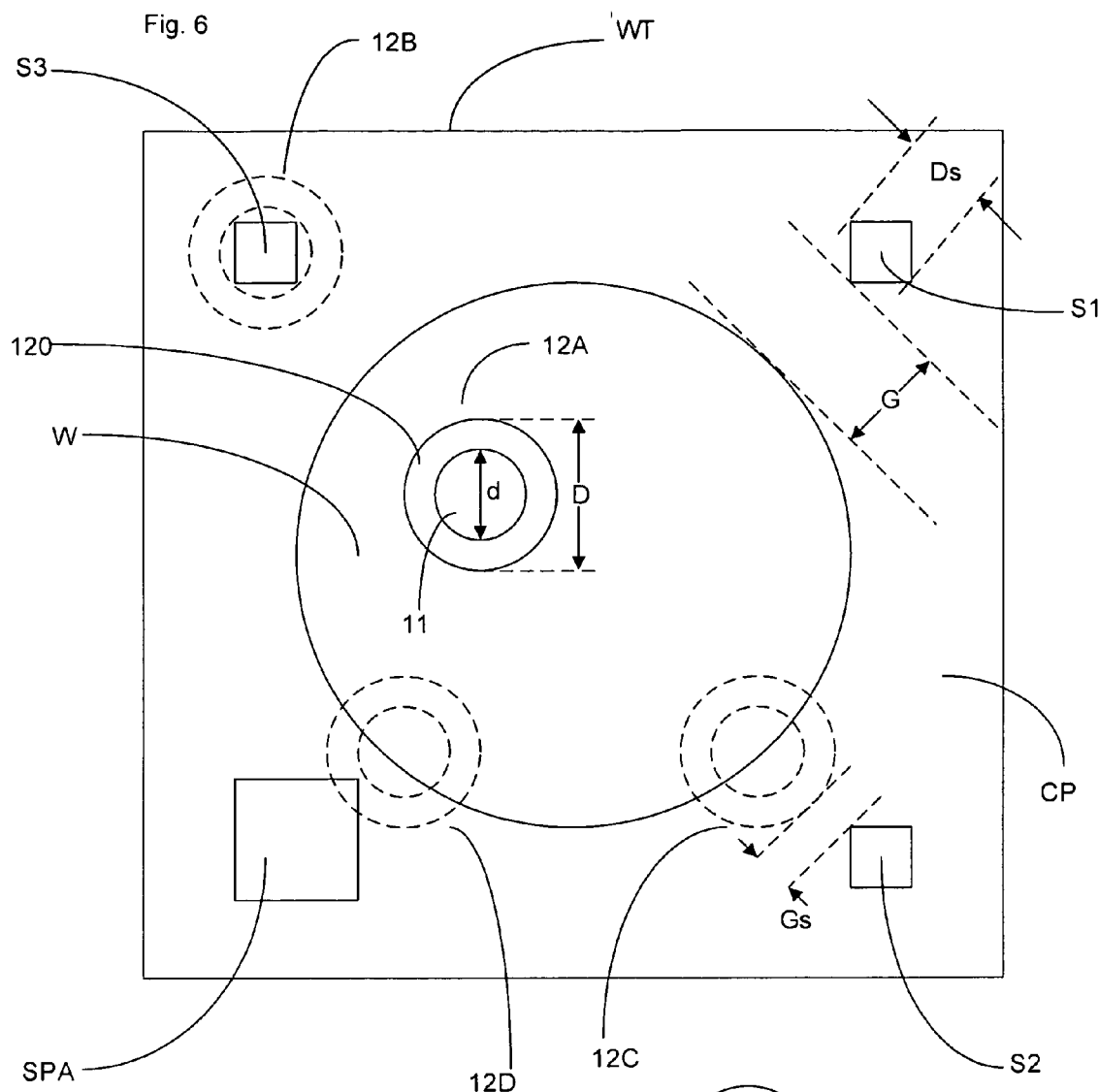
FIG. 6 depicts schematically, in plan, the top surface of a substrate table.

FIG. 6 illustrates, in plan, a substrate table WT. The substrate table WT has a place for the positioning of a substrate W. As the substrate table WT is moved under the projection system PL, the barrier member 12 is positioned over different parts of the substrate table WT. As illustrated, the barrier member 12 is annular in that the inner side wall creates a circular space with a diameter d. The outer side wall of the barrier member 12 gives the barrier member 12 an overall diameter D. Several different barrier member positions 12A-12D are illustrated. Four sensors are also illustrated namely S1, S2 and S3 and a sensor of the prior art SPA.

The prior art sensor SPA is relatively larger than the other sensors S1, S2, S3. During imaging of the edge of the substrate W, the barrier member may be positioned in position 12D. In this position the edge of the barrier member 12D overlaps with sensor SPA thereby leading to the possibility of erosion of the top surface of the sensor SPA. This is particularly the case because the barrier member 12D overlaps the sensor SPA at a position which is likely to be under a position of high velocity immersion liquid because of the position of the extractor 31 near the inner surface of the space 11 of the barrier member 12D. Also, when the barrier member 12D is positioned over the sensor SPA for imaging of the sensor SPA the sensor does not fit entirely within the space 11 defined by inner diameter d of the barrier member 12D because the sensor is too large for the relatively smaller size of the barrier member 12D. Thus, when the sensor SPA is under the projection system PL and is stationary, the areas of high velocity immersion liquid (under the barrier member 12) will be positioned over the sensor SPA and could lead to erosion. This is a particular problem in the case where there is no relative movement of the barrier member 12D and the sensor SPA because of the time dependence of erosion. The positioning and geometry of the sensors S1, S2 and S3 and the liquid supply system are adjusted to avoid high velocity immersion liquid flowing over the sensors for extended periods of time.

The sensor S3 in FIG. 6 is illustrated with the barrier member 12B surrounding it. Because the dimension Ds, which is the maximum dimension of the sensor, is less than the inner circumference d of the barrier member (so that the whole of the sensor is within the area, in plan, which the space 11 covers which is surrounded by the inner walls of the barrier member 12) only lower velocity liquid comes into contact with the sensor S3 top surface because the areas of high velocity liquid are under the barrier member 12B. Thus, by providing a barrier member 12B in which the liquid is provided on a surface greater in area in plan than the area of the top surface of the sensor, erosion of the top surface of the sensor can be reduced. In FIG. 6 it can be seen that the whole of the top surface of the sensor S3 is within the area of low velocity immersion liquid and within the inner surface of the barrier member 12B and not under the barrier member 12B. The same principles apply to other types of liquid supply system where there are areas of high flow rate and areas of lower flow rate.

The distance G between sensor S1, S2, S3 and the substrate W is arranged such that when an edge of the substrate W is imaged, as is the case with barrier member 12C, a gap Gs exits between the edge of the barrier member 12C and the sensor S2. This ensures that erosion of the top surface of the sensor S2 does not take place during imaging of the edge of the substrate W because the sensor is positioned (and/or sized) on the substrate table WT such that all parts of the substrate W can be irradiated through the immersion liquid contained in the barrier member 12 without the immersion liquid from the barrier member 12 coming into contact with the sensor. Thus, Gs can be non existent as immersion liquid does not extend all the way to the edge of the barrier member 12 but only to recess 32 as illustrated in FIG. 5. The same principles apply to other types of liquid supply system.

In a further embodiment, the substrate table WT and the sensor S3 may be moved relative to the barrier member 12B whereby the top surface of the sensor S3 remains within the inner circumference d of the barrier member 12B such that scans along a trajectory can be made in order to capture image information with the sensor S3. In this embodiment the length of the trajectory of the sensor S3 may be inversely proportional with the maximum dimension Ds of the sensor.

Additionally or alternatively, a sensor may be protected in a different way by providing a controller for the flow of immersion liquid out of the liquid supply system which reduces the flow volume of the immersion liquid. In the illustrated embodiment this is particularly under the barrier member 12 when the barrier member 12 is above the top surface of a sensor S1, S2, S3. This reduction in flow volume is particularly relevant for the flow between the barrier member 12 and the top surface of the sensors S1, S2, S3 which flow can be termed a containing flow because it is this flow which ensures that the barrier member 12 does not substantially leak between the bottom surface of the barrier member 12 and the surface over which the barrier member 12 is positioned. The containing flow can be seen as the flow into the extractor 31. Thus, the controller can reduce the under pressure applied to the extractor (the pressure drop across the gap) thereby to reduce the containing flow and thereby the volume of liquid flowing over the sensor between the sensor and the barrier member 12. If the liquid supply system is stationary, as in when imaging the sensor, the containing flow need not be as high to contain the liquid as when the liquid supply system is moving over the surface. Thus, the controller can be set to reduce the flow volume only when the liquid supply system is stationary over the sensor. The flow reduces substantially linearly with pressure drop across the gap.

Alternatively or additionally, the controller can reduce the flow volume by decreasing the gap between the barrier member 12 and the surface over which the barrier member 12 is positioned. Usually this gap is between 30 and 150 µm. By decreasing this gap (e.g., lowering the barrier member 12), the flow volume is relatively reduced. It may be necessary to increase the flow of gas through the gas knife 33 in order to ensure that a seal between the barrier member 12 and the surface on which it impinges (in the case of imaging of a sensor this surface is the top surface of the substrate table WT and illustrated in FIG. 6 for sensor S3 and barrier member 12B) is established or maintained. A reduction in gap size by a factor of 2 results in a reduction in flow by approximately a factor of 4.

Figure 7:
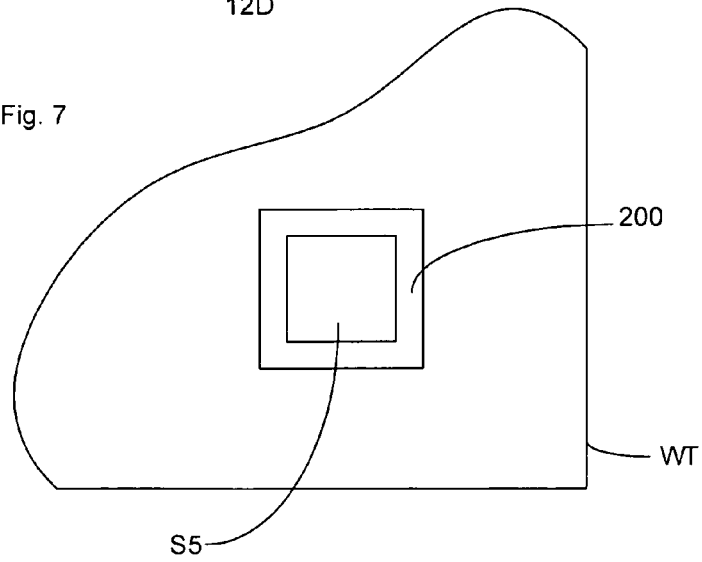
FIG. 7 illustrates, in plan, a part of a substrate table of a further embodiment.

Alternatively or additionally, as shown in FIG. 7, the barrier member 12 may be allowed to leak a little and an extraction ditch 200 is provided around the outside of the sensor S5 on the substrate table WT to take away any leaked immersion liquid. The ditch 200 may be provided directly adjacent to the sensor S5 or may be spaced apart from it and surrounding the sensor S5. Thus, the pressure drop across the gap can be reduced vastly or the barrier member can be lifted away so that the gap is too large for streaming potential damage to take place without need to worry about liquid loss. In both those cases, if no liquid loss occurs, no ditch 200 is necessary.

Figure 8:
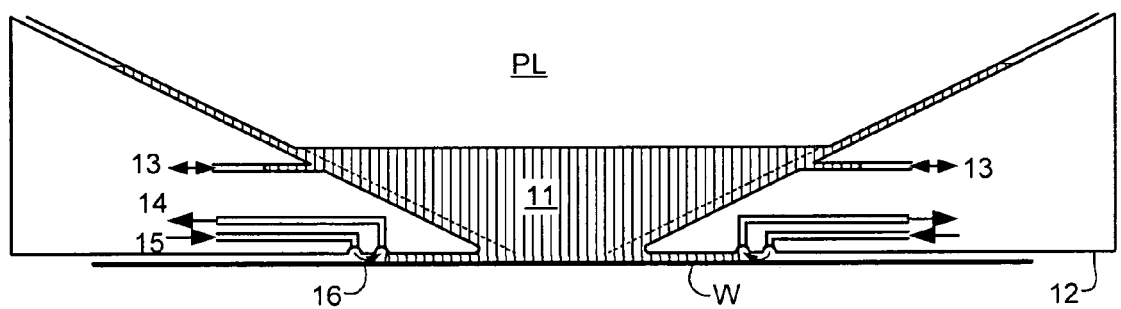
FIG. 8 depicts a section through a barrier member of another liquid supply system.

Although an embodiment of the present invention has been described mostly in relation to the liquid supply system illustrated in FIG. 5, an embodiment of the invention also applies to other types of liquid supply system including those illustrated in FIGS. 2-4. In general, the invention may apply to any liquid supply system which provides immersion liquid to a localized area, particularly to a liquid supply system that provides immersion liquid to a localized area of the substrate and that is used to supply immersion liquid to both the substrate and one or more sensors. An embodiment of the invention is particularly applicable to a liquid supply system in which a gas bearing between a barrier member and a surface is formed and which gas bearing also acts as a contactless seal. In such an embodiment, illustrated in FIG. 8, a flow of gas 16 from an inlet 15 into an outlet 14, which is positioned on the bottom of the barrier member 12 radially inwardly of the inlet 15, is effective to form a seal and a bearing for the barrier member 12. Gas and liquid exit through outlet 14. Immersion liquid is confined to a space 11 between the projection system PL and the substrate W and is supplied to the space 11 through inlets/outlets 13. In such a system the gap between the barrier member 12 and the surface (substrate W) is only about 35 µm and the pressure difference (and therefore the flow) is high (125 mbar approximately) so that such a system is particularly vulnerable to streaming current effects.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus arranged to project a pattern from a patterning device onto a substrate supported on a substrate table, the lithographic projection apparatus comprising a liquid supply system configured to supply liquid to fill a space between a projection system and a surface of the substrate table, wherein the substrate table has a sensor having a top surface exposed to the space, the liquid supply system is configured to provide liquid on a localized area of the surface and in the space which can completely cover all of the top surface of the sensor, and the liquid supply system is constructed and arranged to provide the liquid on all of the top surface of the sensor exposed to the space at a lower velocity than on other areas of the surface.

2. The apparatus according to claim 1, wherein the liquid supply system is also configured to provide liquid between the projection system and the substrate.

3. The apparatus according to claim 2, wherein the liquid supply system is configured to provide liquid to a localized area of the substrate.

4. The apparatus according to claim 1, wherein the liquid supply system is configured to provide liquid on the surface outside of the space.

5. The apparatus according to claim 1, wherein the liquid supply system comprises a barrier member surrounding the space.

6. The apparatus according to claim 5, comprising a seal device configured to form a seal between the barrier member and the substrate.

7. The apparatus according to claim 5, wherein dimensions of the top surface of the sensor are smaller than a periphery of the barrier member.

8. The apparatus according to claim 7, further comprising an actuator configured and arranged to move the sensor along a trajectory within the periphery of the barrier member.

9. A lithographic projection apparatus arranged to project a pattern from a patterning device onto a substrate, the apparatus comprising: a substrate table configured to support a substrate and a sensor; a liquid supply system configured to provide liquid in a space between a projection system and a surface of the substrate table; and a controller configured to control a flow volume of liquid, wherein the controller is configured to reduce the speed of the flow volume when the sensor is beneath the liquid supply system.

10. The apparatus of claim 9, wherein the flow includes or is flow outside of the space.

11. The apparatus of claim 10, wherein the controller is configured to reduce the flow outside of the space by decreasing a gap between the liquid supply system and the substrate table.

12. The apparatus of claim 9, wherein the liquid supply system comprises a barrier member surrounding the space and a seal device configured to form a seal between the barrier member and the surface of the substrate table.

13. The apparatus of claim 12, wherein the controller is configured to control an extractor of the seal device and to achieve the reduction in flow by a reduction in the underpressure applied to the extractor.

14. The apparatus of claim 12, wherein the controller is configured to increase a gas flow rate of gas out of a gas knife of the seal device on reduction of the flow of liquid.

15. The apparatus of claim 9, wherein the sensor has an extractor surrounding it to collect liquid lost by the liquid supply system due to the reduction in flow.

16. The apparatus of claim 9, wherein the flow volume is flow through a gap, one side of the gap being formed by the sensor and the other side being formed by the liquid supply system.

17. A device manufacturing method comprising using a projection system to project a patterned beam of radiation through liquid, provided by a liquid supply system in a space between the projection system and a surface of the substrate table, onto a sensor supported on a substrate table, wherein the liquid supply system provides liquid to a localized area of the surface and in the space which can completely cover all of the sensor's surface exposed to the space, and the liquid supply system provides the liquid on all of the top surface of the sensor exposed to the space at a lower velocity than on other areas of the surface.

18. A device manufacturing method comprising projecting a patterned beam of radiation through liquid, provided by a liquid supply system, onto a substrate supported by a substrate table, wherein following or preceding projecting the patterned beam of radiation onto a substrate, the patterned beam of radiation is projected through liquid, provided by the liquid supply system, onto a sensor also positioned on the substrate table during which projecting onto the sensor, a flow volume of liquid in the liquid supply system is reduced.

* * * * *